United States Patent
Bergsma

(10) Patent No.: US 7,345,541 B2
(45) Date of Patent: Mar. 18, 2008

(54) APPARATUS FOR VARIABLE GAIN AMPLIFIERS AND MIXERS

(75) Inventor: Adrian Bergsma, Kanata (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 112 days.

(21) Appl. No.: 11/257,048

(22) Filed: Oct. 25, 2005

(65) Prior Publication Data

US 2007/0090876 A1    Apr. 26, 2007

(51) Int. Cl.
    *H03F 3/45* (2006.01)
(52) U.S. Cl. .............................. 330/254; 327/359
(58) Field of Classification Search ............... 330/254; 327/359
    See application file for complete search history.

(56) References Cited

U.S. PATENT DOCUMENTS

| 4,516,081 | A |   | 5/1985 | Katakura |
| 5,185,581 | A |   | 2/1993 | Brown |
| 5,933,771 | A | * | 8/1999 | Tiller et al. ............... 330/254 |
| 6,710,657 | B2 |  | 3/2004 | Yang |
| 7,102,435 | B2 | * | 9/2006 | Bosch et al. ............. 330/254 |

* cited by examiner

*Primary Examiner*—Khanh Van Nguyen

(57) ABSTRACT

Novel uses of current-dividing multi-transistors (composite transistors) are described. The composite transistors can replace transistors in otherwise traditional circuits by making suitable design changes. Arrangements of these composite transistors in amplifiers and mixers allow easy selection of current and hence gain in circuits driven by them. In appropriate configurations, they allow the designer to dynamically select the current provided to successive stages. The invention may be used in any integrated circuit technology and assists designers in achieving effective and efficient designs.

22 Claims, 8 Drawing Sheets

APPARATUS FOR VARIABLE GAIN AMPLIFIERS AND MIXERS

FIELD OF THE INVENTION

The present invention relates to amplifiers and mixers, and in particular to variable gain amplifiers and mixers.

BACKGROUND OF THE INVENTION

In typical prior art designs, significant effort must be expended in designing amplifiers and mixers capable of dealing with a very wide variation in input levels (dynamic range) at the same time providing compensation for temperature variations that greatly affect the performance (particularly the gain) of individual devices within the integrated circuit. In spite of these efforts, a considerable amount of customization of designs is require to meet specific operational conditions.

In the past, the need for reducing customization of circuits had been recognized. However, none of them has been entirely successful, and some degree of customization of each design is generally required to meet customer requirements.

SUMMARY OF THE INVENTION

It is an object of the present invention to facilitate customization of the gain of amplifiers and mixers.

In a first aspect, the present invention comprises a selectable gain circuit comprising at least two amplifying elements, a single current source, one or more driven amplifying circuits, and a control circuit, the amplifying elements each comprising a current-dividing multi-transistor, each current-dividing multi-transistor comprising two or more constituent transistors having different current sinking capabilities, the amplifying elements being driven by the single current source, the amplifying elements driving the driven amplifiers, the control circuit making active one or more of the current-dividing multi-transistors to determine the division of current from the current source, thereby determining the gain of the one or more further amplifying circuits.

In a second aspect the present invention comprises a variable gain amplifying apparatus comprising a differential pair current source having a first collector and a second collector, a first quad comprising current-dividing multi-transistors, the first quad being operably coupled to the first collector, a second quad comprising current-dividing multi-transistors, the second quad being operably coupled to the second collector, a first load operably coupled to one collector of the first quad and the second quad, a second load operably coupled to another collector of the first quad and the second quad and a selecting means to make active either one of the quads at a time, thereby providing a means to adjust the gain according to the selected current-dividing multi-transistors.

It is to be appreciated and understood that the foregoing summary of the invention does not necessarily describe all features and attributes of the invention.

This summary of the invention does not necessarily describe all features of the invention.

BRIEF DESCRIPTION OF THE DRAWINGS

Embodiments of the invention will be described with reference to the following figures.

DETAILED DESCRIPTION OF EMBODIMENTS OF THE INVENTION

Current-dividing in proportion to device areas, is used, for example, as a means to provide a fixed, temperature-independent reference source in band-gap reference circuits. It has also been used to give some flexibility to allow matching of devices in the face of process variation. However, this invention extends the use of the current-dividing concept so that it now provides a new and flexible means to simplify the designing of circuits, particularly of integrated circuits (IC), including those IC used in the GHz range.

Preferred embodiments of the invention make use of a current-dividing device in which the division of current is largely temperature-independent. The current-dividing device is in the form of a composite transistor, and, with appropriate circuit modifications, may be used as a replacement for any transistor in a circuit. In one embodiment, this composite transistor (or current-dividing multi-transistor) comprises two constituent transistors having their emitters connected and their bases connected, but with separate collectors, so that the composite device is a four-terminal device. The ratio of the effective area of the two constituent transistors, and hence ratio of the currents passed through each collector of the device, is designed to be a certain value, depending on the application of the device. The current through the collectors is controlled by the voltage or current applied to the connected bases of the constituent transistors. In balanced circuit applications, a pair of these devices, generally, but not necessarily, having the same ratio of effective device areas, is used. Other embodiments of current-dividing multi-transistors are described below.

By providing a number of these composite transistors, each with a different device effective area ratio, in series or parallel combinations for an amplifying stage, and by selecting which one is activated, the system can in effect choose which of the several predetermined current divisions is to be used at any time, and hence select the gain of the amplifying stage. The effective area of the constituent transistor is determined by the actual physical area of the constituent transistor, but in some embodiments may be altered by other factors.

Figure 1:
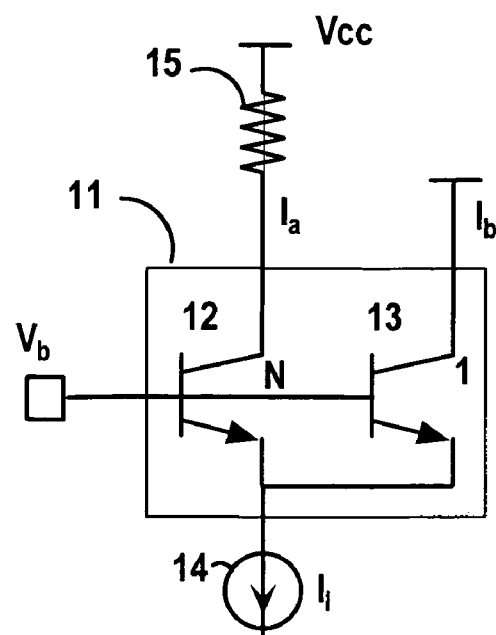
FIG. 1 shows a current-dividing transistor used in embodiments of the invention.

The FIG. 1 shows a single composite transistor (or current-dividing multi-transistor) 11 in a simple unbalanced circuit. The ratio of the effective areas of the two constituent transistors 12 (N units) and 13 (1 unit) ensures that the currents $I_a$ and $I_b$ maintain that same ratio in their respective collector circuits, so that when the control (base) of the composite transistor 11 is selected to be ON, the current through the load 15 is determined to be $I_a$, a fixed proportion of $I_b$, chosen by appropriate design of the ratio of the effective areas N:1 of the pair. The current $I_b$, not required in the load, is diverted. (For clarity, note that here, as elsewhere, the value, such as N, used the ratio need not be an integer, and may be a fraction).

Figure 2:
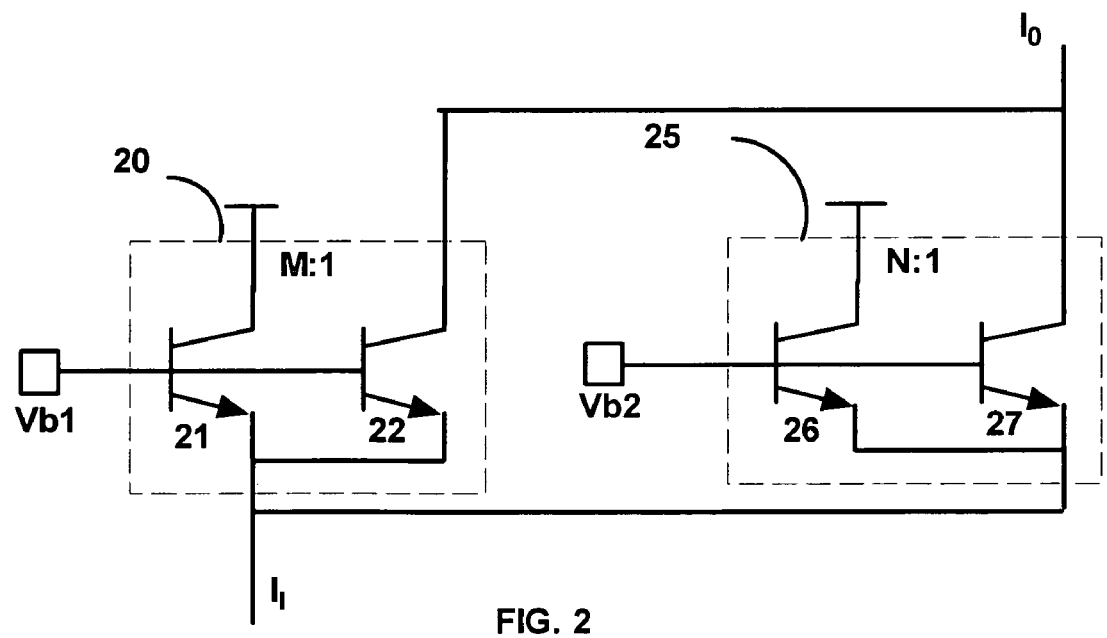
FIG. 2 shows one circuit incorporating current-dividing multi-transistors.

Turning now to the FIG. 2, there are depicted two such composite transistors 20 and 25, each having different ratios of their effective areas M:1 and N:1 of their constituent transistors 21, 22 and 26, 27 respectively. In this fragment of an unbalanced circuit, when the control (base) of 20 is selected to be ON the current $I_o$ is determined by the effective area of the transistor 22, whereas when the control (base) of 25 is selected to be ON the current $I_o$ is determined by the effective area of the transistor 27. Thus, by changing which composite transistor is ON, the current $I_o$ is varied in the ratio $$\frac{1}{1+M}:\frac{1}{1+N},$$

substantially independent of other factors, including temperature.

Figure 3:
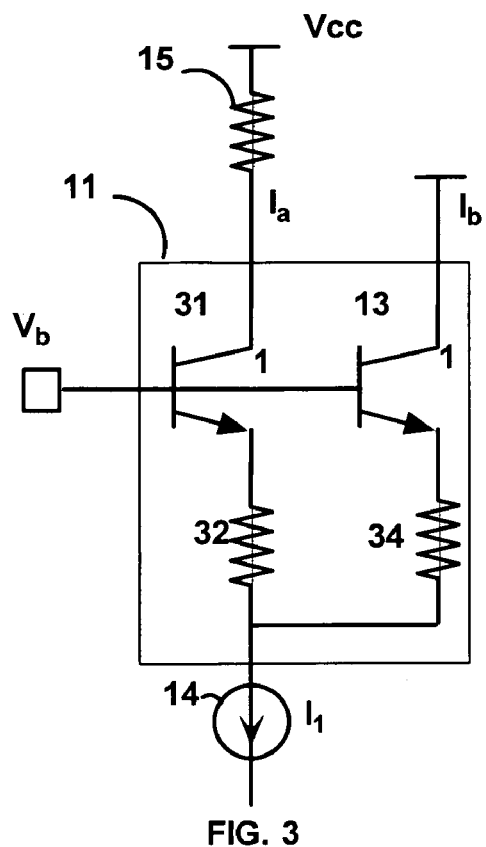
FIG. 3 shows an alternative current-dividing transistor used in embodiments of the invention.

In FIG. 3 is shown an alternative composite transistor, also comprising a pair constituent transistors. In this circuit, performing the same function as that of FIG. 1, the constituent transistors 31 and 13 are physically identical, but the emitter circuit of each contains a series resistor that has the effect of degenerating the performance characteristic of that constituent transistor. In this case, the ratio of the currents through the constituent transistors is controlled by designing the value of the two resistors 32, 34 so that the currents through the constituent transistors 31, 13 have the desired ratio. In some composite transistors the current division is achieved by a combination of both area ratio and emitter resistor ratio. In the following, examples are described using only the area ratio composite transistor of FIG. 1, but it should be understood that either composite transistor or a combination of the composite transistors may be used in circuits embodying the invention.

Figure 5:
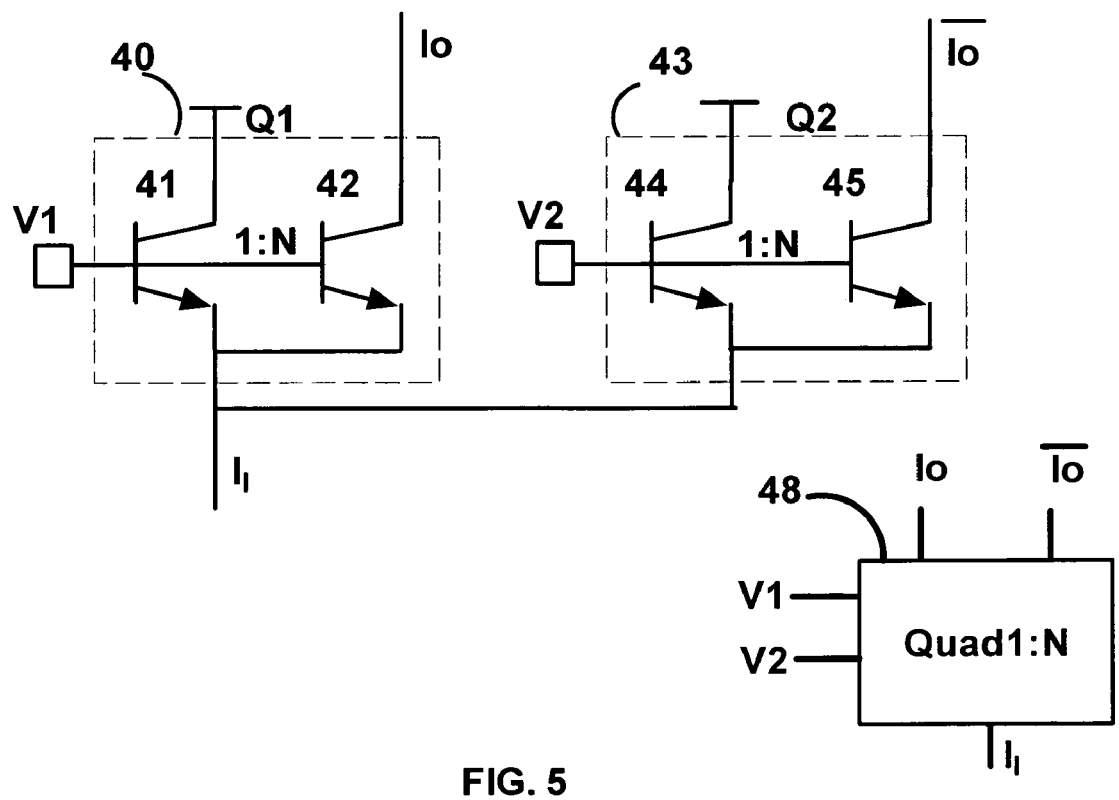
FIG. 5 shows a further circuit incorporating current-dividing multi-transistors

In FIG. 5 is shown a pair of composite transistors. The effective area ratio 1:N of the pair of constituent transistors 41, 42 of the first composite transistor 40 is different from the effective area ratio 1:M of the pair of constituent transistors 44, 45 of the second composite transistor 43. When two pairs of these composite transistors are part of a balanced circuit, the balanced configuration is called a 'quad'. A simplified symbolic representation 48 of a quad is also shown, and this symbol is used in later circuits.

Figure 6:
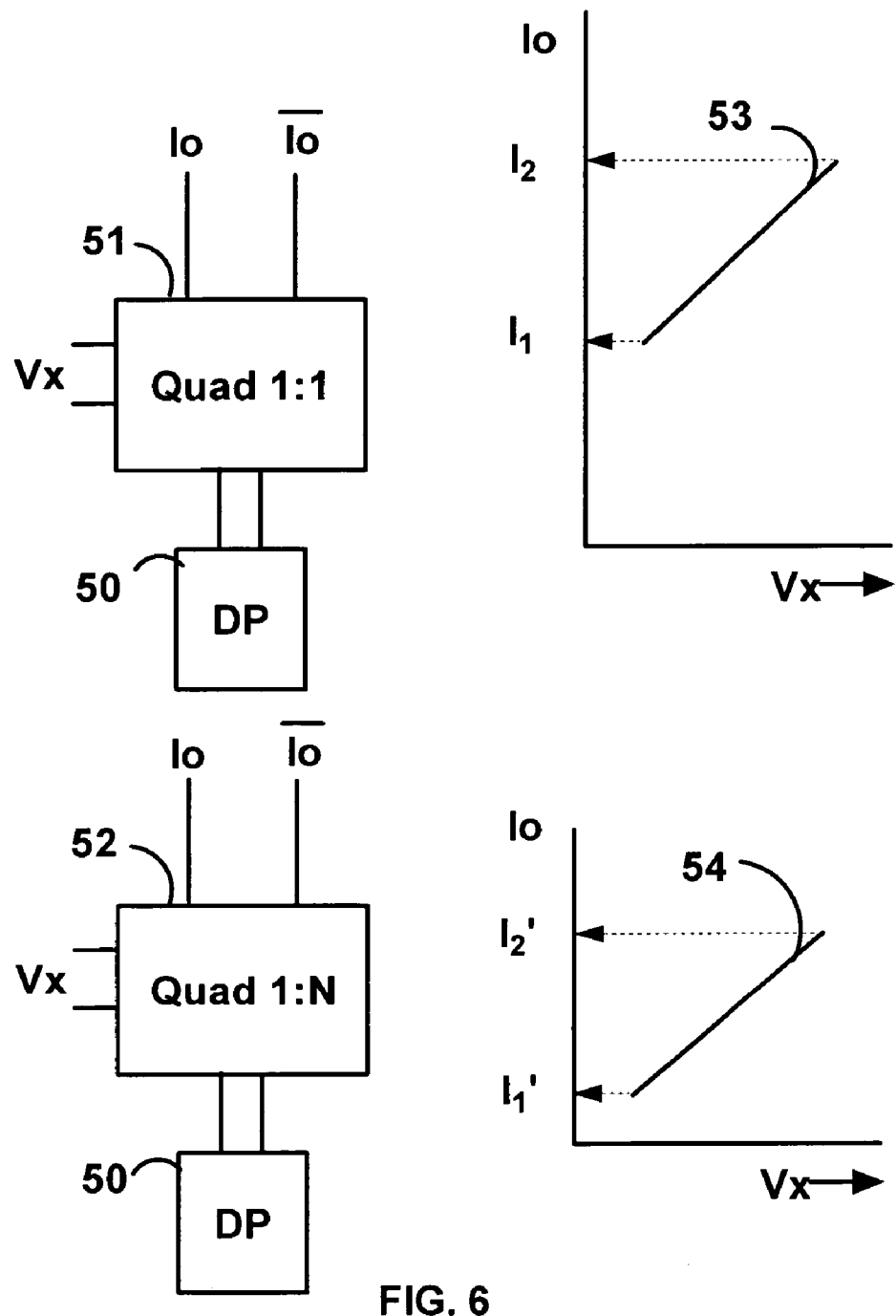
FIG. 6 illustrates the variable gain aspect of the invention relative to the prior art.

Now consider FIG. 6 that shows two quads 51, 52, each having a different effective area ratio and fed by a differential pair 50. The gain control transfer functions 53, 54 for each of these quads is shown, and the difference in gain can be seen in the two situations. In this case the y-axis currents $I_1$ and $I_2$, for the gain control transfer function 54, are reduced accordingly to $I_1'$ and $I_2'$.

Figure 7:
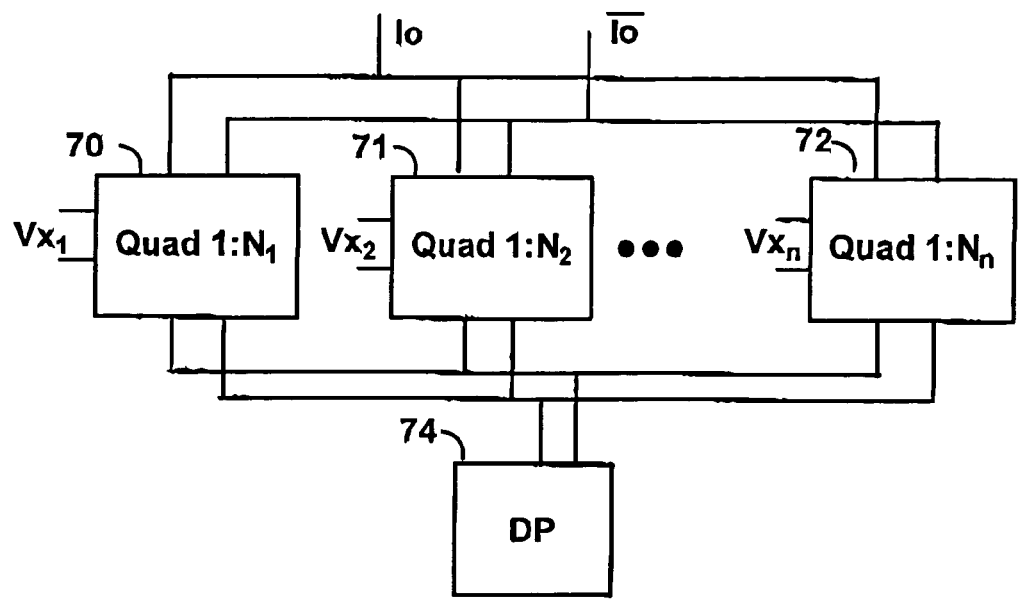
FIGS. 7 and 8 show one example of an embodiment of the invention with the resultant transfer function.
Figure 8:
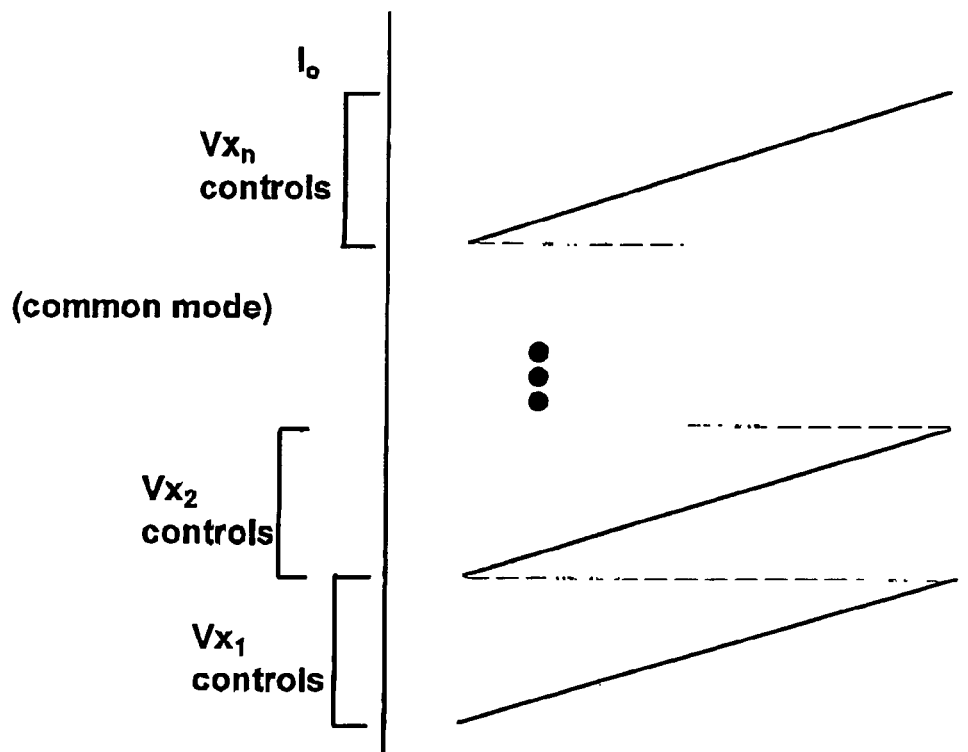

Consider the situation in FIG. 7 where a number of quads 70, 71, 72 are connected in parallel and fed by a single differential pair (DP) 74. Any one of the quads 70, 71, 72 may be activated by application of the appropriate common-mode bias conditions to the inputs $Vx_1 \ldots Vx_n$. This means that, for a given fixed common current source, such as that provided by a differential pair (DP) driver circuit 74, the ratio of the current directed to the load, and hence the gain of the quad, can be selected in the ratio $K_1:K_2: \ldots :K_n$, where for example $$K_x = \frac{N_x}{1+N_x},$$

by activating the appropriate quad. The effective transfer function of this arrangement is shown in the FIG. 8, where each segment of the function is controlled by a unique input range, selected by the controlling voltage $Vx_n$ (common mode). Here, $$Vx_n=Vx_n(\text{common mode})+Vx_n(\text{differential mode})$$

In some embodiments, the circuit to create the activation currents is made dependent on a binary coded word, thereby simplifying interfaces to a controlling system.

In some embodiments, the gain control transfer function is designed to be other than linear.

In some embodiments, the gain is further made variable by adjusting the bias voltages appropriately, with the design restriction that the range of the bias voltage must not be such as to enable any other of the parallel quads. This allows a wide and quasi-continuous range of gains to be achieved.

In some embodiments, the currents passing through the collectors not connected to the load are used to supplement currents in complementary circuits, thereby improving power usage and efficiency.

Figure 10:
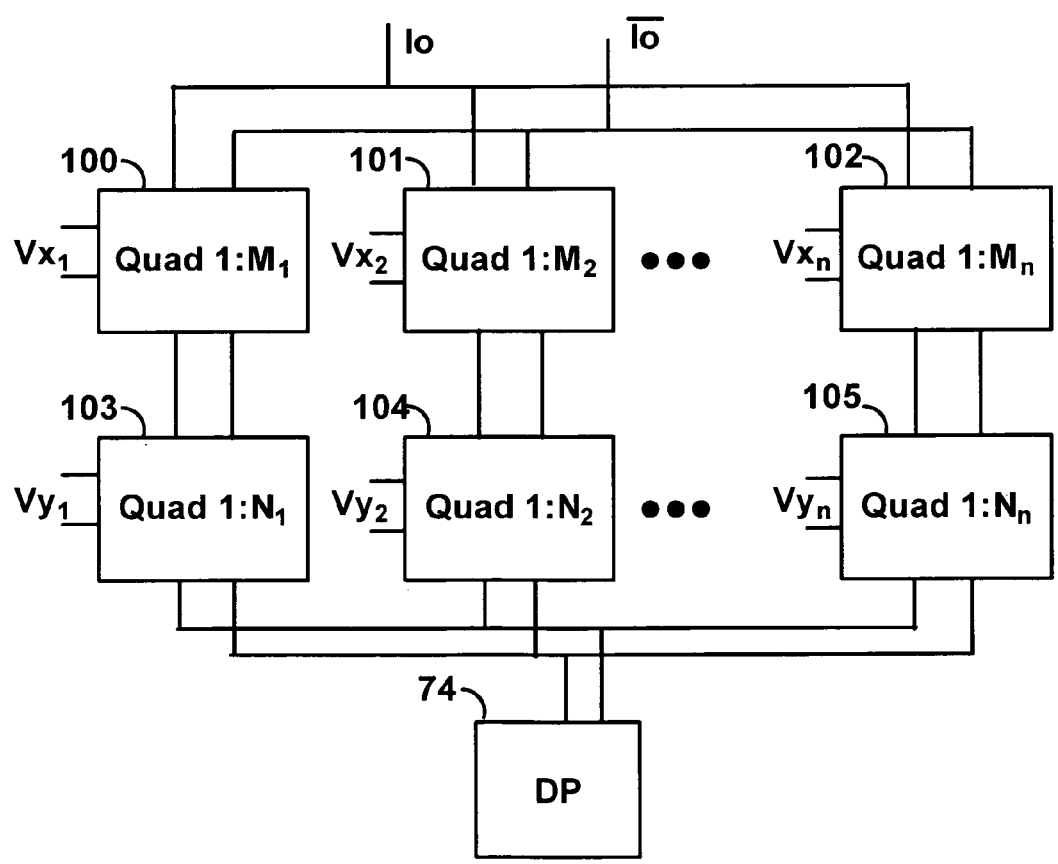
FIG. 10 shows a cascaded system using embodiments of the invention

In some embodiments, more than one set of quads is provided in a cascaded configuration thus offering a wider set of design gain possibilities. These embodiments also permit more complex mixing functions. FIG. 10 shows an example where quads 100-102 having effective area ratios $1:M_1-1:M_x$ respectively are cascaded with quads 103-105 having effective area ratios $1:N_1-1:N_x$ respectively. When the n-th pair of quads 1-x are selected, then $I_o=M_n \cdot N_n \cdot I_{in}$.

Figure 11:
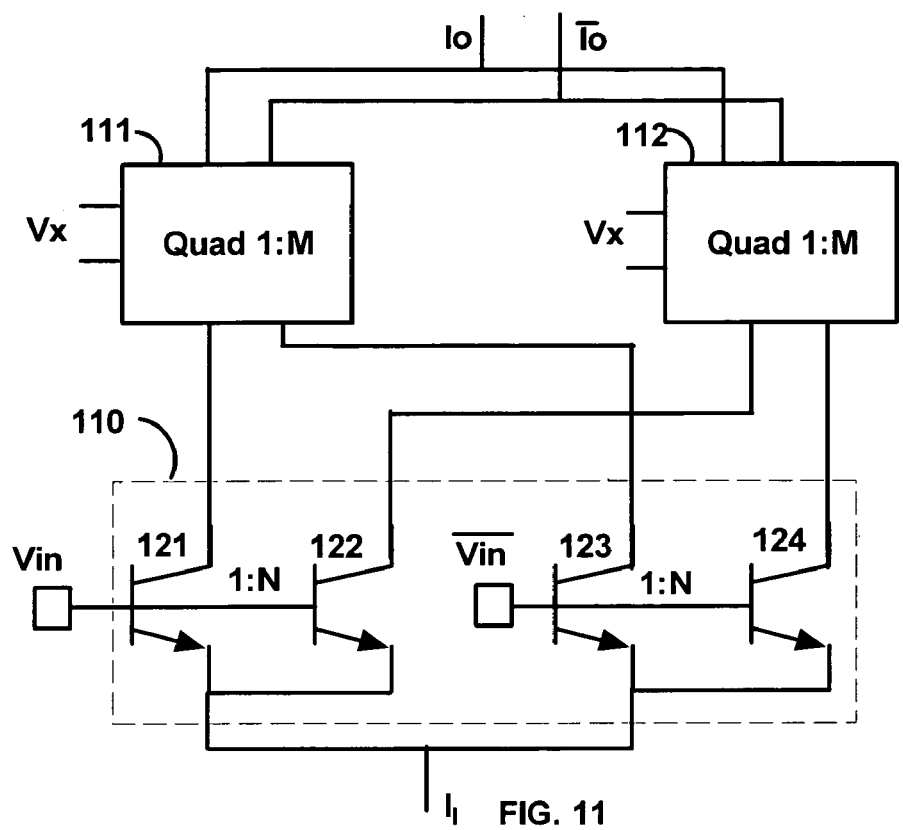
FIG. 11 show the use of composite transistor in the differential pair stage.

In some embodiments, a differential pair drive circuit comprises composite transistors, thereby adding another element of design freedom. An example circuit is shown in FIG. 11, where the differential pair 110 feeds two similar quads 111, 112. Both quads have the same effective area ratio in this case, further embodiments having more quads, and some with different area ratios. Since the differential pair 110 comprises composite transistors 121, 122, 123, 124 connected as described earlier in FIG. 4, the currents provided to the quads 111, 112 can be selected to be divided differently, thereby providing a further degree of design variability.

Figure 9:
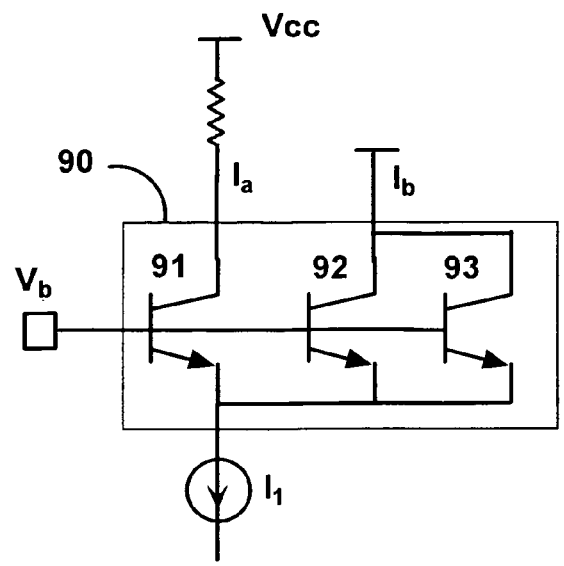
FIG. 9 illustrates an alternative configuration for a composite transistor.

In some embodiments, the constituent transistors themselves comprise one or more transistors, each of substantially equal (or, preferably, equal) physical area connected in parallel. The effective area of the resultant constituent transistor is therefore an integer number times that of a single constituent transistor. This is illustrated in FIG. 9 showing a composite transistor 90 comprising three constituent transistors 91, 92, 93, of which 92 and 93 are arranged to behave as a single constituent transistor (by connecting all the like terminals together), thereby providing a composite transistor 90 having a known current-dividing ratio. A single design for the constituent transistor used multiple times in such circuits tends to improve the accuracy of the current-dividing ratio.

In some embodiments, the current source for a differential pair comprises multiple current sources to provide further flexibility of design.

Figure 12:
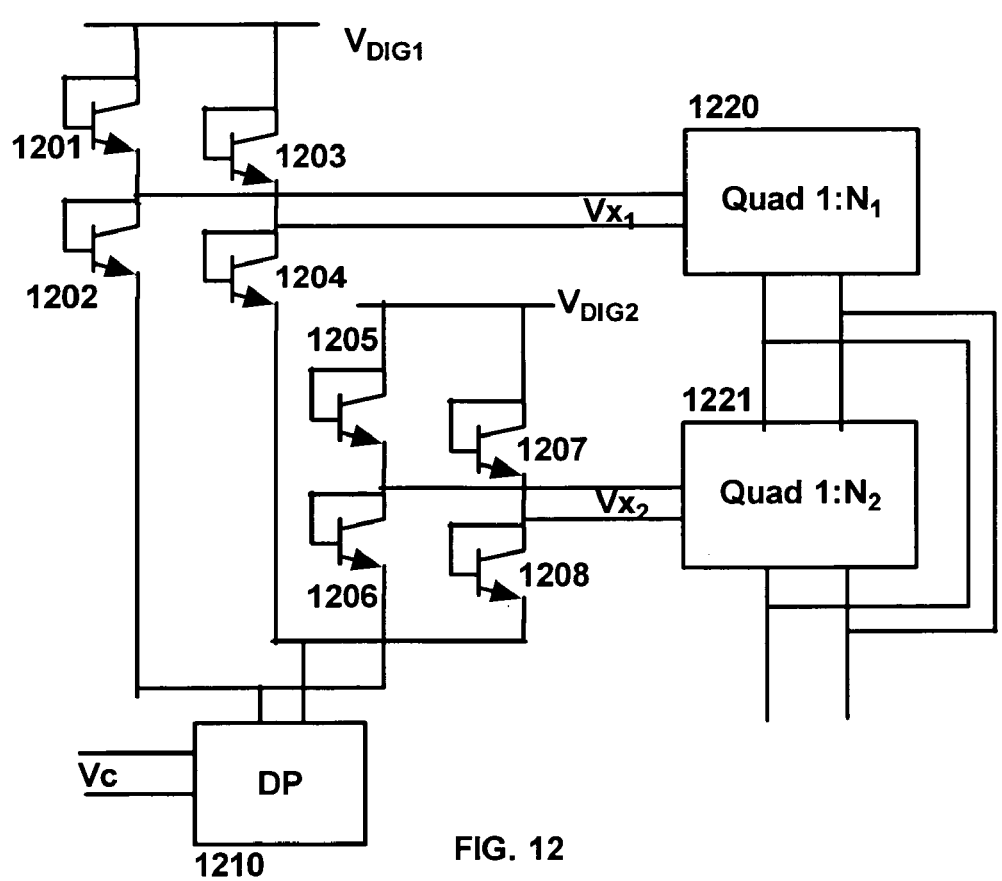
FIG. 12 shows one possible driver design for use with embodiments of the invention.

Embodiments of the invention make use of control circuits that permit easy design and implementation of the selection of the quads required. They permit customization of the controlling input levels with minimal impact on the design of the controlled circuits. FIG. 12 shows a fragment of a design in which the bias and selection of a quad is achieved using series-connected diodes (in this case diode connected transistors) 1201-1204, and 1205-1208. These diodes control the bias of the quads 1220, 1221 respectively, when $V_{DIG1}$ or $V_{DIG2}$ are activated, so that the differential pair 1210 drives the selected quad. Other embodiments use resistors in place of the diodes to achieve similar results.

Alternative embodiment of control circuits are possible, such as using parallel inputs to a number of differential pairs, each differential pair providing Vx to one of a like number of quads.

The usefulness of composite transistors, and the 'quad' configurations described above, is further illustrated in the following examples, each an embodiment of the invention.

Gilbert Mixer Cell

Figure 4:
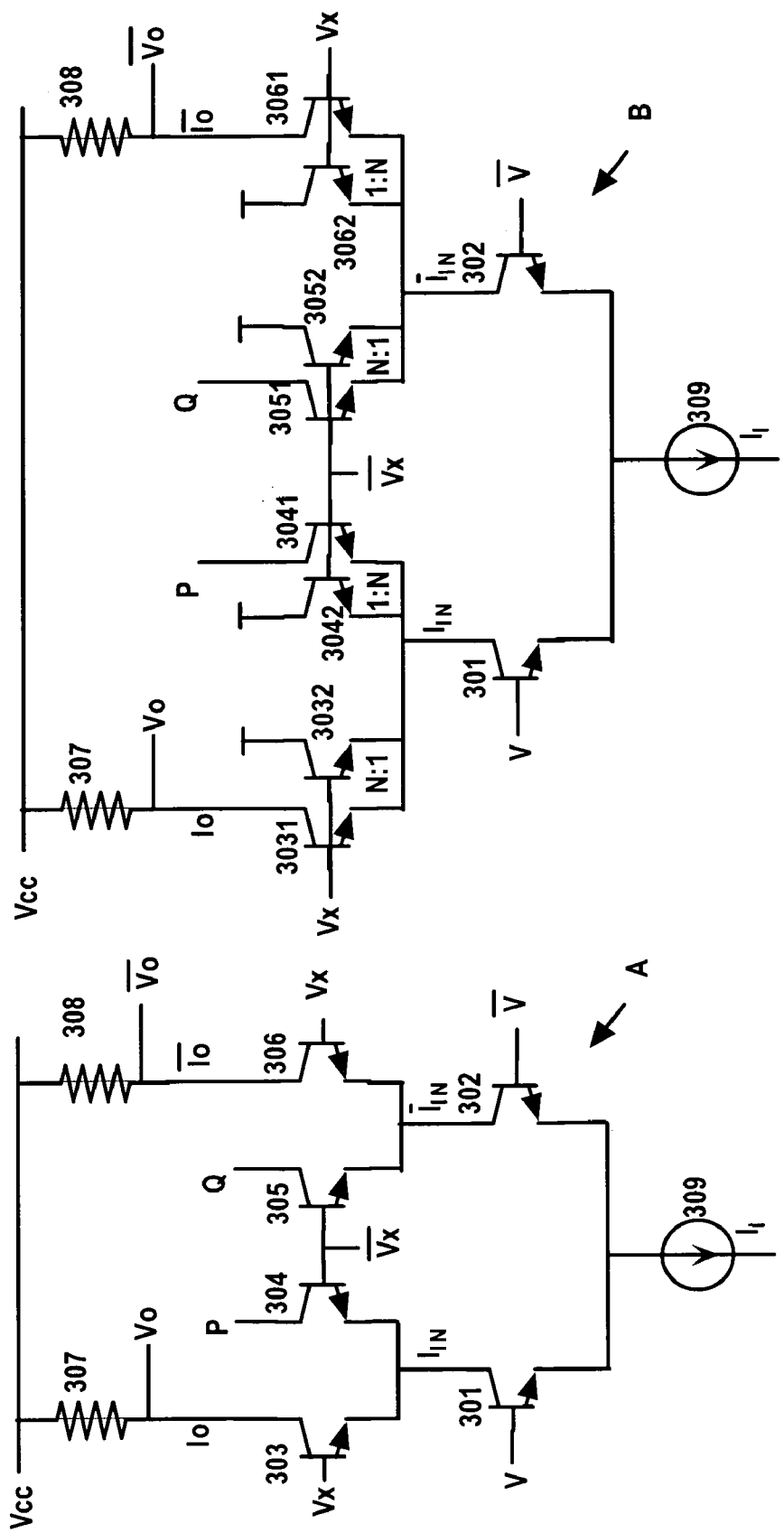
FIG. 4 shows a prior art Gilbert mixer and compares it to one embodying the present invention.

A prior art Gilbert mixer is shown in FIG. 4 at A, while B is a Gilbert mixer incorporating an embodiment of the present invention. In the prior art design A, the differential pair 301, 302, controlled by V, $\overline{V}$, drive the quad 302, 304, 305, 306 which is controlled by Vx, $\overline{Vx}$, (the Vx differential being the local oscillator signal,) and provides the output currents Io and $\overline{Io}$ to the loads, (shown here as resistors 307, 308 to generate the output Vo, $\overline{Vo}$, although other loads are possible). The collectors P, Q of 304 and 305 may be connected to other circuit elements in ways well known in the art. The differences from the prior art design are readily apparent in B of FIG. 4, in that each transistor 303, 304, 305, 306, (the 'quad') is replaced by a current-dividing multi-transistor. Here, the pairs are shown separately viz. 3031, 3032 replaces 303, etc. Otherwise the design is strikingly similar. The 'extra' transistors 3032, 3042, 3052 and 3062 are each arranged to sink their current in some way other than to the loads 307, 308.

The benefits of applying embodiments of the invention to a Gilbert mixer cell configuration become apparent when a number of quads are provided, connected in parallel as shown earlier in FIG. 7, each comprised of current dividing multi-transistors having a different device area ratio, and hence a different current dividing ratio. When any one of the quads is enabled, by suitable selection and bias means (such as that described at FIG. 12), the current directed to the load is determined by the current dividing ratio of that quad. Thus, with little effort, designs can be provided with a variety of currents (and hence gains) selectable by the user during use. As each of these current ratios is determined by the relative physical area of the constituent transistors (or in some embodiments, by degenerating resistors, or a combination of the two techniques), and is largely independent of temperature, these embodiments offer considerable advantages over prior art practice.

Linearising a Gain Control Transfer Function

Figure 13:
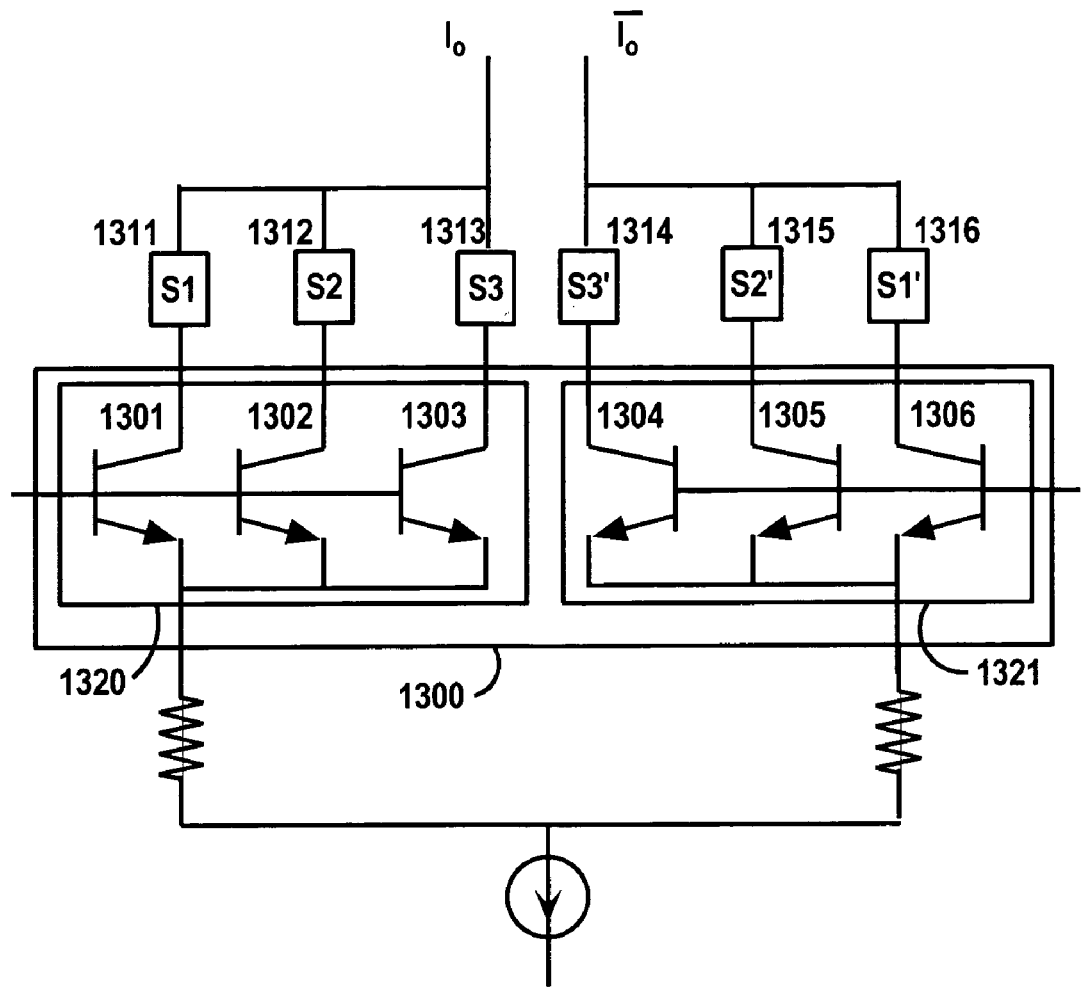
FIG. 13 show a further extension of the design of a differential pair stage.

FIG. 13 shows a fragment of a circuit illustrating a further example of a situation where embodiments of the invention might be used. Here, the gain control transfer function of an amplifier is capable of being altered by adjusting the currents dynamically, or during configuration, adding a further 'design' choice that can be taken following production of circuits containing the invention. In this circuit each of the two parts 1320, 1321 of a composite transistor 1300 comprise three constituent transistors 1301-1303 and 1304-1306 respectively. The effective areas of the three constituent transistors in each part are designed to be in the ratio 1:2:4, thereby permitting the selection of any one of seven different currents, in addition to OFF, the total output currents being in the ratios 1:2:3:4:5:6:7. The selection of which constituent transistor pair is used is achieved by means of switches 1311-1316, each switch being in series with the collector of its related device. In some cases, one or more switches 1311-1316 may be omitted so that the relevant collector is always in operation.

Although some of the examples given to illustrate embodiments of the invention are balanced circuits, embodiments of the invention are equally applicable in single ended (un-balanced) circuits.

The embodiments are described here in terms of bipolar transistors, although they may be applied to any integrated circuit technology using transistors, including, but not limited to Si Bipolar Junction Transistor (BJT), SiGe BJT, and MOS. In such embodiments the descriptions above should be read to include the equivalent terms for the emitter, base and collector of a bipolar transistor, such as source, gate and drain.

The introduction of composite transistors provides the designer with another tool to allow cost-effective designs of more complex nature than was practicable before. In particular, the following advantages are apparent:

- The gains of circuits, being largely dependent on stable physical attributes of their constituent transistors, or on passive components associated with the emitters of their constituent transistors, are to a practical degree independent of temperature.
- The gain of an amplifying stage using quads can be selected using a 'binary word' to reflect the user's requirements, providing a simple interface to an externally provided (digital) control system.
- Gains of quads may also be controlled by a combination of the 'digitally selected' quads comprising composite transistors and the analog or continuous function associated with a 'normal' transistor, providing gains that are substantially stable, yet flexible in their selection.
- A broad range of gains can be incorporated into the basic design of an amplifier, reducing the need for customization of designs.
- A quad comprising composite transistors allows for these improvements without the need for adding further cascaded stages in a design, thereby providing additional flexibility without the need for increasing supply rail voltages.
- Gain control transfer functions other than linear gain control functions can be incorporated into appropriate circuit designs.
- Post-manufacture changes can be more easily accommodated, using the inherent flexibility provided by the invention.

The present invention has been described with regard to one or more embodiments. However, it will be apparent to persons skilled in the art that a number of variations and modifications can be made without departing from the scope of the invention as defined in the claims.

The present invention has been described with regard to one or more embodiments. However, it will be apparent to persons skilled in the art that a number of variations and modifications can be made without departing from the scope of the invention as defined in the claims.

What is claimed is:

1. A selectable gain circuit comprising:
   at least two amplifying elements;
   one or more current sources;
   one or more driven amplifying circuits; and
   a control circuit;
   the amplifying elements each comprising a current-dividing multi-transistor, each current-dividing multi-transistor comprising two or more constituent transistors having different current sinking capabilities,
   the amplifying elements being driven by the one or more current sources, the amplifying elements driving the driven amplifying circuits, the control circuit making active one or more of the current-dividing multi-transistors to determine the division of current from the one or more current sources, thereby determining the gain of the one or more driven amplifying circuits.

2. The selectable gain circuit of claim 1 wherein the selectable gain circuit is implemented as an integrated circuit.

3. The selectable gain circuit of claim 1 wherein each constituent transistor of at least one of the current-dividing multi-transistors has a different effective area.

4. The selectable gain circuit of claim 1 wherein each constituent transistor of at least one of the current-dividing multi-transistors has a different value of degenerating series resistor.

5. A variable gain amplifying apparatus comprising:
   a differential pair current source having a first collector and a second collector;
   a first quad comprising current-dividing multi-transistors, the first quad being operably coupled to the first collector;
   a second quad comprising current-dividing multi-transistors, the second quad being operably coupled to the second collector;
   a first load operably coupled to one collector of the first quad and to one collector of the second quad;
   a second load operably coupled to another collector of the first quad and to another collector of the second quad; and
   a selecting means to make active either one of the quads at a time, thereby providing a means to adjust the gain according to the selected current-dividing multi-transistors.

6. The amplifying apparatus of claim 5, wherein the first quad comprises:
   a first pair of current-dividing multi-transistors having a current dividing ratio;
   a second pair of current-dividing multi-transistors in parallel with the first pair of current-dividing multi-transistors the second pair having the current dividing ratio, the first and second pairs of current-dividing multi-transistors being operatively coupled to the first collector circuit of the differential pair current source; and
   wherein the second quad comprises:
   a third pair of current-dividing multi-transistors having the current dividing ratio; and
   a fourth pair of current-dividing multi-transistors in parallel with the third pair of current-dividing multi-transistors, the fourth pair of current dividing multi-transistors having the current dividing ratio, the third and fourth pairs of current-dividing multi-transistors being operatively coupled to the second collector circuit of the differential pair current source.

7. The amplifying apparatus of claim 5 wherein each pair of the current-dividing multi-transistors comprises:
   a first transistor having a first effective area and a first controlling electrode, a first emitting electrode and a first collecting electrode; and
   a second transistor having a second effective area and a second controlling electrode, a second emitting electrode and a second collecting electrode;
   wherein the first controlling electrode and the second controlling electrode are operatively coupled together, the first emitting electrode and the second emitting electrode are operatively coupled together, the first effective area and the second effective area having a ratio, thereby providing a related ratio of currents through the first collecting electrode and the second collecting electrode.

8. The amplifying apparatus of claim 5 wherein each pair of the current-dividing multi-transistors comprise:
   a first transistor having a first controlling electrode, a first emitter electrode, a first degenerating emitter resistor and a first collector electrode; and
   a second transistor having a second controlling electrode, a second emitter electrode, a second degenerating emitter resistor and a second collector electrode;
   wherein the first controlling electrode and the second controlling electrode are operatively coupled together, the first degenerating emitter resistor and the second degenerating emitter resistor are operatively coupled together, the first degenerating emitter resistor and the second a degenerating emitter resistor having a ratio, thereby providing a related ratio of currents through the first collector electrode and the second collector electrode.

9. The amplifying apparatus of claim 7 wherein the ratio of the first and second effective areas is fixed to give a specific current dividing ratio.

10. The amplifying apparatus of claim 8 wherein the ratio of the values of the first degenerating emitter resistor and the second a degenerating emitter resistor is fixed to give a specific current dividing ratio.

11. The amplifying apparatus of claim 5 further comprising one or more additional quads similarly coupled, wherein the selecting means makes active one or more of the quads at a time.

12. The amplifying apparatus of claim 5 including one or more further quads comprising current-dividing multi-transistors, cascaded in series with the quads comprising current-dividing multi-transistors, thereby providing a means to apply more than one controlling voltage and signal.

13. The amplifying apparatus of claim 5 implemented as an integrated circuit.

14. A variable gain mixing apparatus comprising:
   a differential pair current source having a first collector and a second collector;
   a first quad comprising current-dividing multi-transistors, the first quad being operably coupled to the first collector;
   a second quad comprising current-dividing multi-transistors, the second quad being operably coupled to the second collector;
   a first load operably coupled to one collector of the first quad and to one collector of the second quad;
   a second load operably coupled to another collector of the first quad and to one collector of the second quad; and a selecting means to make active either one of the quads at a time, thereby providing a means to adjust the gain according to the selected current-dividing multi-transistors.

15. The mixing apparatus of claim 14 wherein the first quad comprises:
   a first pair of current-dividing multi-transistors having a current dividing ratio;
   a second pair of current-dividing multi-transistors in parallel with the first pair of current-dividing multi-transistors the second pair having the current dividing ratio, the first, and second pairs of current-dividing multi-transistors being operatively coupled to the first collector circuit of the differential pair current source; and wherein the second quad comprises:
   a third pair of current-dividing multi-transistors having the current dividing ratio; and
   a fourth pair of current-dividing multi-transistors in parallel with the third pair of current-dividing multi-transistors, the fourth pair of current dividing multi-transistors having the current dividing ratio, the third and fourth pairs of current-dividing multi-transistors being operatively coupled to the second collector circuit of the differential pair current source.

16. The mixing apparatus of claim 14 wherein each pair of the current-dividing multi-transistors comprise:
   a first transistor having a first effective area and a first controlling electrode, a first emitting electrode and a first collecting electrode; and
   a second transistor having a second effective area and a second controlling electrode, a second emitting electrode and a second collecting electrode;
   wherein the first controlling electrode and the second controlling electrode are operatively coupled together, the first emitting electrode and the second emitting electrode are operatively coupled together, the first effective area and the second effective area having a ratio, thereby providing a related ratio of currents through the first collecting electrode and the second collecting electrode.

17. The mixing apparatus of claim 14 wherein each pair of the current-dividing multi-transistors comprise:
   a first transistor having a first controlling electrode, a first emitter electrode, a first degenerating emitter resistor and a first collector electrode; and
   a second transistor having a second controlling electrode, a second emitter electrode, a second degenerating emitter resistor and a second collector electrode;
   wherein the first controlling electrode and the second controlling electrode are operatively coupled together, the first degenerating emitter resistor and the second degenerating emitter resistor are operatively coupled together, the first degenerating emitter resistor and the second degenerating emitter resistor having a ratio, thereby providing a related ratio of currents through the first collector electrode and the second collector electrode.

18. The mixing apparatus of claim 16 wherein the ratio of the first and second effective areas is fixed to give a specific current dividing ratio.

19. The mixing apparatus of claim 17 wherein the ratio of the values of the first degenerating emitter resistor and the second a degenerating emitter resistor is fixed to give a specific current dividing ratio.

20. The mixing apparatus of claim 14 further comprising one or more additional quads similarly coupled, wherein the selecting means makes active one or more of the quads at a time.

21. The mixing apparatus of claim 14 including one or more further quads comprising current-dividing multi-transistors, cascaded in series with the quads comprising current-dividing multi-transistors, thereby providing a means to apply more than one controlling voltage and signal.

22. The mixing apparatus of claim 14 implemented as an integrated circuit.

* * * * *